United States Patent
Jacques

(10) Patent No.: US 7,432,722 B2
(45) Date of Patent: Oct. 7, 2008

(54) FLEXIBLE CONTINUITY AND CIRCUIT TESTER

(76) Inventor: James Jacques, 5250 N. Oracle #15, Tucson, AZ (US) 85704

(*) Notice: Subject to any disclaimer, the term of this patent is extended or adjusted under 35 U.S.C. 154(b) by 0 days.

(21) Appl. No.: 11/763,429

(22) Filed: Jun. 14, 2007

(65) Prior Publication Data
US 2007/0296418 A1    Dec. 27, 2007

Related U.S. Application Data

(60) Provisional application No. 60/816,913, filed on Jun. 27, 2006.

(51) Int. Cl.
*G01R 31/02* (2006.01)
*G01R 31/44* (2006.01)

(52) U.S. Cl. .................. 324/537; 324/414; 324/550; 324/556

(58) Field of Classification Search ............ 324/414, 324/550, 556
See application file for complete search history.

(56) References Cited

U.S. PATENT DOCUMENTS

| | | | | |
|---|---|---|---|---|
| 2,501,548 A * | 3/1950 | Street | ............ | 324/414 |
| 3,725,780 A * | 4/1973 | Olin | ............ | 324/414 |
| 4,056,773 A * | 11/1977 | Sullivan | ............ | 324/500 |
| 4,702,563 A * | 10/1987 | Parker | ............ | 349/199 |
| 5,008,626 A * | 4/1991 | Boyd, Sr. | ............ | 324/414 |
| 5,453,683 A * | 9/1995 | Pagano | ............ | 324/156 |
| 5,650,727 A * | 7/1997 | Lapping et al. | ............ | 324/502 |
| 6,690,184 B1 * | 2/2004 | Akram | ............ | 324/754 |
| 2002/0109508 A1 * | 8/2002 | Huang | ............ | 324/556 |

* cited by examiner

*Primary Examiner*—Vincent Q. Nguyen
*Assistant Examiner*—John Zhu
(74) *Attorney, Agent, or Firm*—Timothy M. Barlow

(57) ABSTRACT

A flexible circuit and continuity testing device may include a flexible printed circuit substrate. A battery having a positive and negative terminal may be attached to the substrate. An illumination source, e.g., an LED, may be attached to the substrate. The testing device may include a flexible electrical contact array, a small bulb tester, a fuse tester and a system tester. Each of these may be incorporated into the substrate and coplanar with the substrate. The contact array may include a planar coil shape, a semicircular shape, a pair of parallel contacts, a set of converging contacts or other configurations. The device may be about the size and shape of a credit card. The substrate may include a magnet or a pocket clip.

12 Claims, 3 Drawing Sheets

FLEXIBLE CONTINUITY AND CIRCUIT TESTER

PRIORITY DATA

The present invention claims priority from U.S. provisional patent application Ser. No. 60/816,913, filed on Jun. 27, 2006, entitled "Continuity Tester", and is hereby incorporated by reference.

BACKGROUND OF THE INVENTION

1. Field of the Invention

The present invention relates generally to circuit testers, and more specifically to a flexible circuit and continuity tester.

2. Description of Related Art

Generally, to determine if a bulb is good, it is the common practice to shake it and listen for a separated filament, look for scratches upon the inside of a frosted surface left by a separated filament, or to screw it into a known operating socket. Visual inspection of the tiny filament is difficult and sometimes misleading. The use of a common continuity-testing device with two conductive lead wires is an awkward process. To perform this task, the user must attempt to make contact with both leads, hold the bulb stationary, and observe the light indicator all at the same time.

The continuity and bulb-testing devices that are currently available are either the common continuity tester with one or more external wires and probes, or devices providing receiver with contacts for the bulb base mounted in a fixed or rigid relation to each other. Such devices, while functional, are not compact or easy to use.

Thus, what is needed is a flexible continuity and circuit tester that is compact, easy to use and eliminates the shortcomings of existing devices.

SUMMARY OF THE INVENTION

The present invention is therefore directed to a flexible continuity and circuit tester, which substantially overcomes one or more of the problems due to the limitations and disadvantages of the related art.

This invention relates to electrical testing devices, for light bulbs, fuses and other electrical components and devices, which use low voltage electrical current supplied by a battery to determine electrical continuity. The testing device may transmit current through a flexible conductive material to an object's electrical contacts to determine its electrical integrity, e.g., a light bulb's filament. When the filament is in good condition, electrical continuity may be achieved and the current may be conducted to illuminate an integral light source to provide a visual display of electrical continuity. Electrical contacts to test fuses may be incorporated along an edge of the testing device. These lateral contacts may be attached to the battery and the illumination source.

The testing device provides a light bulb and continuity tester which may include all of the necessary features of this circuitry in a single, flexible, planar printed circuit. The testing device may be operated by light hand pressure against a light bulb's electrical contacts or other device to be tested. Such pressure may flex the card's substrate to engage the testing device's electrical contact array. When a flexible, elastically movable contact array is provided, the testing device's contacts may be utilized upon a bulb's base in a single hand motion. This simple operation would eliminate necessity for separate wires, clips or probes, and the dexterity issues they introduced. The flexible continuity and circuit tester may save time and is very convenient to use. The device may be very compact, with all the components arranged in a single plane and without separable structures, the testing device may be very easy to store and transport and may be instantly ready for use. It may be easily clipped or slipped into a shirt pocket, may be magnetized for placement on metal surfaces, or may be attached to a lanyard.

Within the area of a small card-sized device, several different sizes and types of bulb and fuse testing contacts could be incorporated; possibly large and small base common bulbs and fuses, auto bulbs and appliance fuses, Christmas bulbs, as well as contacts for using common alligator clips to contact wire leads for testing continuity in large fuses. These could all share the same circuitry and battery. Since the use would be very momentary, battery life would be quite considerable, compared to a current tester with separate circuits. The card could also incorporate a battery tester or current tester with separate circuits. The contact, which moves by the flexing of the card's material, could either be made possible by a perforation from the edge as a bendable tab using slits from the outer edge or in the interior of the device by a perforation of a certain shape such as a spiral, horseshoe, chevron, converging straight contacts, circular, or parallel straight contacts. The conductive material of the contacts could be on the surface or integral to the material throughout from one side to the other.

It is a feature of the invention to provide a flexible continuity and circuit tester that is arranged in a planar structure.

It is a feature of the invention to provide a flexible continuity and circuit tester that approximates the size of a credit card.

Still another feature of the invention is to provide a flexible continuity and circuit tester that includes elastically deformable electrical contacts.

Still another feature of the invention is to provide a flexible continuity and circuit tester that includes an integral power source.

Yet another feature of the invention is to provide a flexible continuity and circuit tester that includes an integral light source.

It is a feature of the invention to provide improved elements and arrangements thereof for the purposes described which is inexpensive, dependable and fully effective in accomplishing its intended purposes.

In some example embodiments of the present invention, the flexible continuity and circuit tester may include an LED illumination source.

In some example embodiments of the present invention, the flexible continuity and circuit tester may include a contact array arranged in a planar shape. The planar contact array may include a coil shape. The planar contact array may include a semicircular shape. The planar contact array may include a linear shape. The planar contact array may include a converging contact arrangement.

In some example embodiments of the present invention, the flexible continuity and circuit tester may include lateral electrical contacts along an edge of the flexible substrate.

In some example embodiments of the present invention, the flexible continuity and circuit tester may include an integral magnet.

In some example embodiments of the present invention, the flexible continuity and circuit tester may include a pocket clip.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

Similar reference characters denote corresponding features consistently throughout the attached drawings.

DETAILED DESCRIPTION OF THE DRAWINGS

Figure 1:
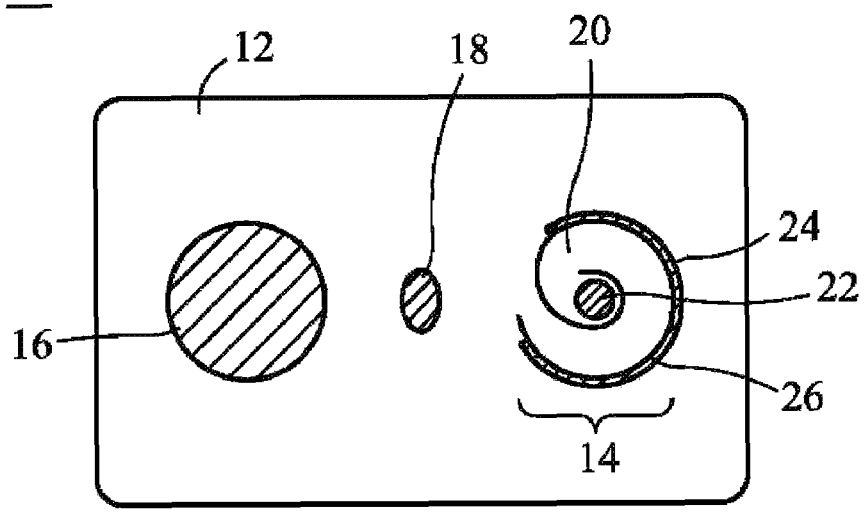
FIG. 1 illustrates a top view of a flexible continuity and circuit tester, according to the present invention.

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

Spatially relative terms, such as "beneath," "below," "lower," "above," "upper" and the like, may be used herein for ease of description to describe one element or feature's relationship to another elements or features as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented rotated 90 degrees or at other orientations and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms including technical and scientific terms used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
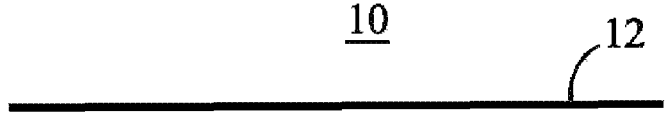
FIG. 2 illustrates a side view of a flexible continuity and circuit tester, according to the present invention.

FIGS. 1-2 illustrate top and side views of a flexible continuity and circuit tester.

Figure 3:
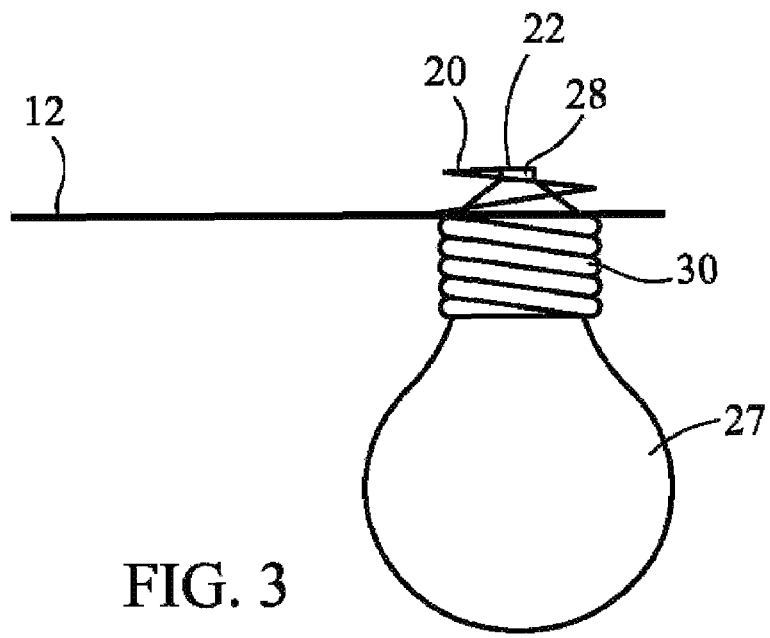
FIG. 3 illustrates a side view of a flexible continuity and circuit tester in use, according to the present invention.

A flexible continuity and circuit tester 10 includes a flexible substrate 12. The flexible substrate 12 may incorporate a printed circuit or other circuitry to allow selective electrical communication between the various components of the flexible continuity and circuit tester 10. A power source 16, e.g., a battery, may be incorporated into the flexible substrate 12 so as to be invisible. A thin watch-type battery, e.g., CR2016, may be employed in such a fashion. The power source 16 may be mounted directly into the flexible substrate 12 or a dedicated holder may be used for more accurate and secure placement of the power source 16. An illumination source 18, e.g., an LED, may be incorporated into the flexible substrate 12 and wired to the power source 16 with a single conductor. A flexible, elastic contact array 14 may be incorporated into the flexible substrate 12 and wired to the illumination source 18 with a single conductor and to the power source 16 with another single conductor. In one embodiment, the power source 16 includes a positive terminal and a negative terminal. The illumination source 18 may include a first electrical lead and a second electrical lead, and the first lead may be attached to the positive terminal of the power source 16. The flexible electrical contact array 14 may include a pair of adjacent, independent contacts. A first contact 22 may be attached to the negative terminal of the power source 16 and a second contact 24 may be attached to the second lead of the illumination source 18. This arrangement may form an open circuit when the adjacent independent contacts of the contact array 14 are not in contact with each other, either directly or through another conductor. A perforation or gap 26 may be provided in the flexible substrate 12 to permit deflection of the flexible lead 20 with the first contact 22. FIGS. 1 and 3 illustrate a perforation having a spiral shape.

Figure 4:
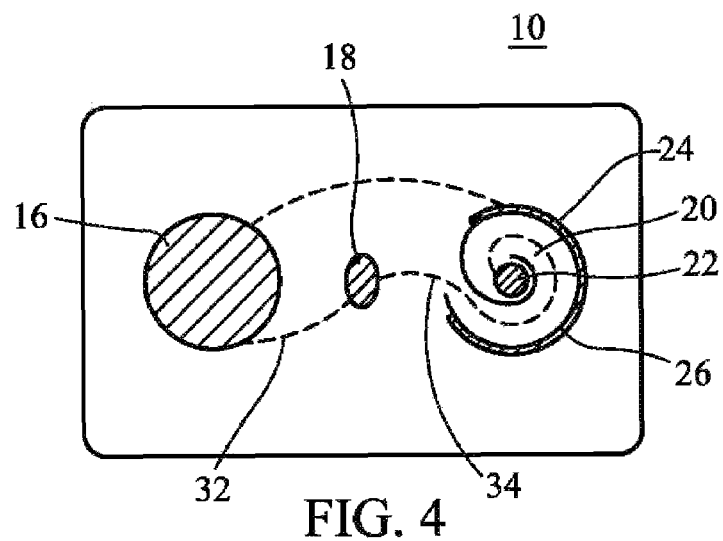
FIG. 4 illustrates a simplified circuit diagram for a flexible continuity and circuit tester, according to the present invention.

FIG. 2 illustrates the planar form of the flexible continuity and circuit tester 10. FIG. 3 illustrates a side view of the flexible continuity and circuit tester 10 with a light bulb 27 in position for testing. The tester 10 is easily operated with one hand, and with the other hand free to hold the object to be tested, e.g., a light bulb 27. A light bulb's center contact 28, at its tip, is brought into contact with the first contact 22 of the contact array 14. The light bulb is then pressed against the contact array 14 to deflect the flexible elastic lead 20 of the contact array 14. As the flexible elastic lead 20 is deflected, the light bulb's threaded contact 30 will bear against the second contact 24 of the contact array 14. If the light bulb's filament is unbroken, the light bulb 27 will complete the circuit between the first contact 22 and second contact 24 of the contact array 14 and may allow the illumination source 18 to receive power from the power source 16. Thus powered, the illumination source 18 signals the user that the light bulb 27 is functional. If the filament is broken, the light bulb 27 will not complete the circuit in the tester 10, and the illumination source 18 will not operate. FIG. 4 illustrates a simple wiring diagram embodying the principles discussed above. The dotted lines represent electrical connections between the power source 16, illumination source 18 and the contact array 14. The circuit may remain open until a conductor connects the first contact 22 and the second contact 24 of the contact array 14. The contact array 14 is not limited to the spiral configuration illustrated in FIGS. 1, 3 and 4.

Figure 5A:
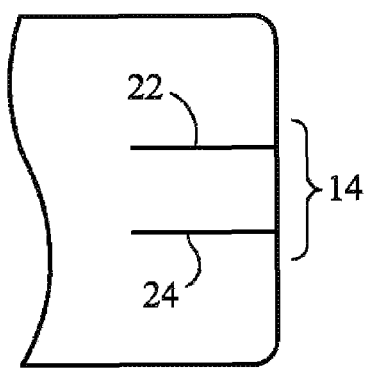
FIGS. 5A-5C illustrate various embodiments of flexible elastic contact arrays for a flexible continuity and circuit tester, according to the present invention.
Figure 5B:
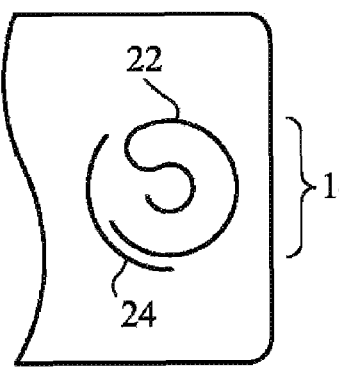
Figure 5C:
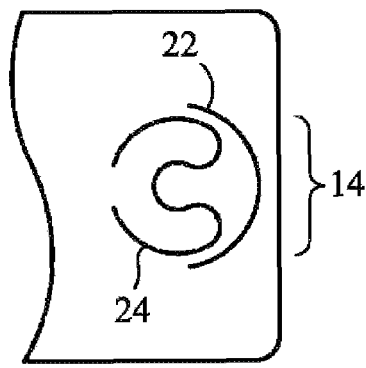

FIGS. 5A-5C illustrate various embodiments of flexible elastic contact arrays 14 for a flexible continuity and circuit tester 10. FIG. 5A illustrates a parallel arrangement of the first contact 22 and second contact 24 of the contact array 14. The first and second contacts 22, 24 may also be converging toward each other to provide more spacing variability between the contacts 22, 24, which may be useful for testing bulbs of different sizes. FIGS. 5B-5C illustrate contact arrays 14 having semicircular or broken circle arrangements. However, the tester 10 is not limited to the shapes of the contact arrays 14 described herein.

Figure 6:
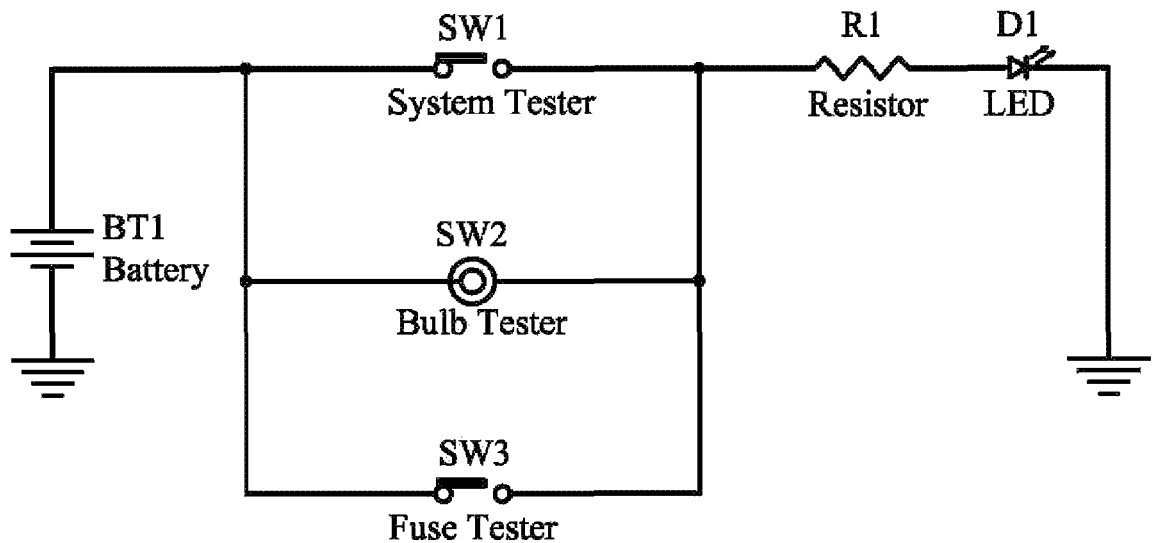
FIG. 6 illustrates a circuit diagram for a flexible continuity and circuit tester, according to the present invention.

FIG. 6 illustrates a circuit diagram for the tester 10 which provides additional capabilities. A fuse tester 36 may be incorporated into a flexible continuity and circuit tester 10. A pair of fuse contacts 38, 40 may be incorporated into the flexible substrate 12, at an edge for example. The fuse contacts 38, 40 may be attached to the power source 16 and the illumination source 18 in the same manner as the contact array 14. Such an arrangement will not compromise the operation of the tester 10 in any way. In addition, a system tester 42 may be incorporated into the flexible substrate 12 as well. The system tester 42 may provide a means to test the power source and the illumination source of the flexible continuity and circuit tester 10. A momentary-on switch 42 may be used to close the circuit. The illumination source 18 will illuminate if the flexible continuity and circuit tester 10 is operating properly. The momentary-on switch 42 will automatically open the circuit when it is released. Further, an aperture 44 for testing very small bulbs, e.g., holiday lights, may be incorporated into the flexible substrate 12. The aperture 44 may include a pair of aperture contacts 46, 48 opposite each other. A small bulb, e.g., a threadless bulb, may be placed into the aperture 44 so that the small bulb's conductors bear against the aperture contacts 46, 48. The aperture contacts 46, 48 may be wired in the same manner as the contact array 14 and the fuse tester 36 through the flexible substrate 12. FIG. 6 illustrates an embodiment of a flexible continuity and circuit tester having a resistor R1 adjacent to the LED D1. In another embodiment, one of the several varieties of field effect transistors (FET), e.g., a JFET or MOSFET, is inserted into the circuit adjacent the LED D1, e.g., conductor 34 shown in FIG. 4. The FET may act like a switch in response to a variety of electrical conditions, thus preventing false readings.

Figure 7:
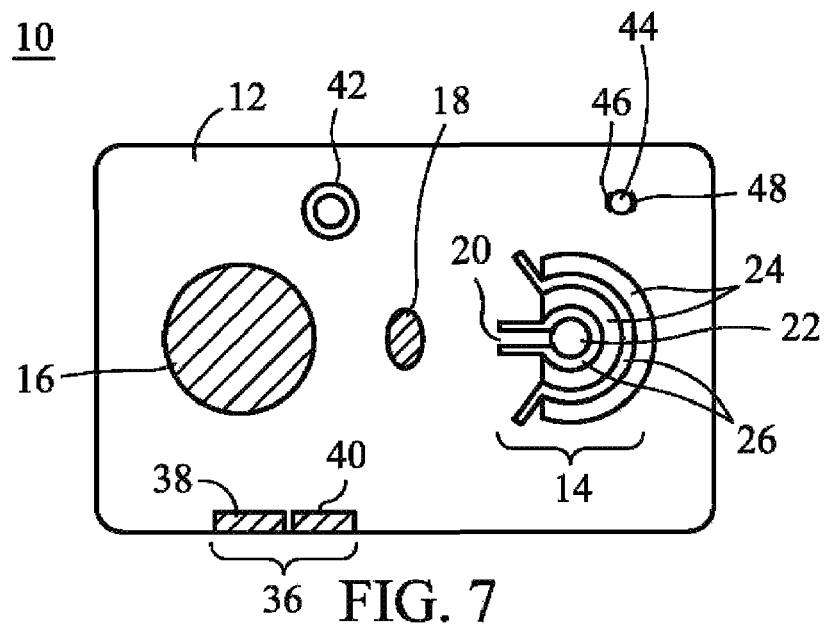
FIG. 7 illustrates a top view of a flexible continuity and circuit tester, according to the present invention.

FIG. 7 illustrates a top view of a flexible continuity and circuit tester 10 that incorporates a light bulb tester 14, a small bulb tester 44, a fuse tester 36 and a system tester 42. In addition, a thin magnet may be embedded in the flexible substrate 12 so that the flexible continuity and circuit tester 10 can be stored on virtually any steel surface, e.g., a refrigerator or tool box. A pocket clip may be formed in the flexible substrate 12 in a manner similar to the flexible elastic lead 20 to keep all of the components coplanar with the flexible substrate 12.

I claim:

1. A flexible circuit and continuity testing device, comprising:
    a flexible printed circuit substrate;
    a battery attached to the substrate, the battery having a positive terminal and a negative terminal;
    an illumination source attached to the substrate, the illumination source including a first electrical lead and a second electrical lead, the first lead attached to the positive terminal of the battery; and
    a flexible electrical contact array incorporated into the substrate and coplanar with the substrate, the contact array including a pair of adjacent, independent contacts, a first contact attached to the negative battery terminal and a second contact attached to the second lead of the illumination source.

2. The flexible circuit and continuity testing device of claim 1, where the illumination source is an LED.

3. The flexible circuit and continuity testing device of claim 1, where the contact array includes a planar coil shape.

4. The flexible circuit and continuity testing device of claim 1, where the contact array includes a semicircular shape.

5. The flexible circuit and continuity testing device of claim 1, where the contact array includes a pair of parallel contacts.

6. The flexible circuit and continuity testing device of claim 1, where the contact array includes a set of converging contacts.

7. The flexible circuit and continuity testing device of claim 1, where the substrate conforms to the general size and shape of a credit card.

8. The flexible circuit and continuity testing device of claim 1, further comprising
    a pair of edge contacts incorporated into an edge of the substrate, a first edge contact attached to the negative battery terminal and a second edge contact attached to the second lead of the illumination source.

9. The flexible circuit and continuity testing device of claim 1, further comprising
    an aperture extending through the substrate; and
    a pair of lateral contacts opposite from each other in the aperture, a first lateral contact attached to the negative battery terminal and a second lateral contact attached to the second lead of the illumination source.

10. The flexible circuit and continuity testing device of claim 1, further comprising
    a system test switch attached to the substrate, the switch including a pair of internal contacts biased to create an open circuit in the absence of external pressure, a first internal contact attached to the negative battery terminal and a second internal contact attached to the second lead of the illumination source.

11. The flexible circuit and continuity testing device of claim 1, further comprising a magnet in the substrate.

12. The flexible circuit and continuity testing device of claim 1, further comprising a flexible elastic pocket clip.

* * * * *